United States Patent [19]

Mishima

[11] Patent Number: 5,592,615
[45] Date of Patent: Jan. 7, 1997

[54] MALFUNCTIONING PARTS DETECTING DEVICE AND A METHOD OF DETECTING MALFUNCTIONING PARTS

[75] Inventor: Nobuhiro Mishima, Toyokawa, Japan

[73] Assignee: Minolta Co., Ltd., Osaka, Japan

[21] Appl. No.: 352,809

[22] Filed: Dec. 1, 1994

[30] Foreign Application Priority Data

Dec. 6, 1993 [JP] Japan ..................... 5-305127

[51] Int. Cl.⁶ ........................... G01R 31/28; G06F 11/00
[52] U.S. Cl. ........................ 395/183.2; 371/20.5
[58] Field of Search ................ 395/183.19, 183.2; 371/20.4, 20.5

[56] References Cited

U.S. PATENT DOCUMENTS

| | | | |
|---|---|---|---|
| 4,178,582 | 12/1979 | Richman | 371/20.5 |
| 4,499,580 | 2/1985 | Takahashi | 371/17 |
| 4,499,581 | 2/1985 | Miazga | 395/183.2 |
| 4,554,662 | 11/1985 | Suzuki | 395/183.2 |
| 4,685,102 | 8/1987 | Lewis | 370/15 |
| 4,860,119 | 8/1989 | Maniwa | 358/296 |
| 5,010,544 | 4/1991 | Chang | 371/20.5 X |
| 5,161,162 | 11/1992 | Watkins | 395/183.19 |
| 5,224,149 | 6/1993 | Garcia | 379/5 |

FOREIGN PATENT DOCUMENTS 60-168212  8/1985  Japan .

Primary Examiner—Robert W. Beausoliel, Jr.
Assistant Examiner—Glenn Snyder
Attorney, Agent, or Firm—Burns, Doane, Swecker & Mathis, LLP

[57] ABSTRACT

In an apparatus having a main control section and sub-control sections connected to the control section through communication lines for executing desired operations by means of mutual intercommunication with the control section through the communication lines, first and second tri-state buffers are provided between the communication lines and the main control section and between the communication lines and the sub-control section respectively. The tri-state buffers short the communications lines by respective test signals output from the main control sections. When the test signal is not retransmitted to the control section through the communication lines shorted by the second tri-state buffer, anomalous operation of the sub-control section is detected. When the test sinal is not retransmitted to the control section through the communication lines shorted by the first tri-state buffer, anomalous operation of the main control section is detected.

7 Claims, 5 Drawing Sheets

MALFUNCTIONING PARTS DETECTING DEVICE AND A METHOD OF DETECTING MALFUNCTIONING PARTS

BACKGROUND OF THE INVENTION

1. Field of the Invention

The present invention relates to a malfunctioning parts detecting device and a method of detecting malfunctioning parts in office automation equipment such as copying apparatus, printers and the like.

2. Description of the Related Art

In recent years the construction of mechanical elements of controlled sections have become more complex in office automation equipment such as copying apparatus, printers and the like, and the control section used to control the operation of said controlled sections has also become more complex. In the case of copying apparatus, for example, the construction of the control section unavoidably become more complex due to the necessity of controlling the operations of various functions such as paper feeding, optical exposure, developing and the like using a predetermined timing.

In recent years, consideration has been given to the points at which the controlled sections may be divided by each function of paper feeding, optical exposure, developing and the like so as to simplify the construction of the control section as much as possible. Thus, control sections have come to be distributed in arrangements of a main control section which controls continuous copying operations, and sub-control section provided for the operation of each function. Additional sub-control sections have been provided for installable options of the copying apparatus such as automatic document feeder, large capacity paper feeding devices and the like, and the operation of these sub-control sections is also controlled by the aforesaid main control section.

Although the construction of the aforesaid control section is simplified, when an occasion arises wherein a sub-control section does not execute a desired operation, specifically determining where the problem lies among the main control section, sub-control sections, and controlled sections is not simply achieved. Particularly in the case of copying apparatus, it often happens that service personnel must be dispatched to repair the apparatus when anomalous operation occurs. In such instances, service personnel typically can not bring specialized measuring devices and thus, the repair operation takes a long time and is based on experience and guess work of the service personnel.

Methods have been proposed for detecting malfunctioning parts in each control section via the operation of switches provided in each control section. However, the controls sections of copying apparatus are provided at various locations in said apparatus, such that operation of all the switches provided throughout a copying apparatus is extremely troublesome. Furthermore, providing a plurality of switches in each control section may lead to erroneous operation.

SUMMARY

An object of the present invention is to provide a method of detecting malfunctioning parts capable of simply specifying a malfunctioning part in office automation equipment such as copying apparatus, printers and the like.

Another object of the present invention is to provide a method of detecting malfunctioning parts capable of reliably specifying a malfunctioning part in the aforesaid office automation equipment in a short time.

These and other objects of the invention are achieved by providing a malfunctioning parts detection device providing a control section, sub-control sections connected to said control section through communication lines and executing desired operations by means of mutual intercommunication with said control section through said communication lines, first reply means actuated by a first predetermined signal output from said control section and provided between said communication lines and said control section for retransmitting the first predetermined signal to said control section, second reply means actuated by a second predetermined signal output from said control section and provided between said communication lines and each of said sub-control sections for retransmitting the second predetermined signal to said control section, and detecting means which detects anomalous operation of the sub-control section when the second predetermined signal is transmitted to said second reply means and is not retransmitted back to said control means, and detects anomalous operation of the control section is detected when the first predetermined signal is transmitted to said first reply means and is retransmitted back to said control means.

These and other objects, advantages and features of the present invention will become apparent from the following description thereof taken in conjunction with the accompanying drawings which illustrate specific embodiments of the invention.

BRIEF DESCRIPTION OF THE DRAWINGS

In the following description, like parts are designated by like reference numbers throughout the several drawings.

DETAILED DESCRIPTION OF THE PREFERRED EMBODIMENTS

The preferred embodiments of the present invention are described hereinafter with reference to the accompanying drawings.

Figure 1:
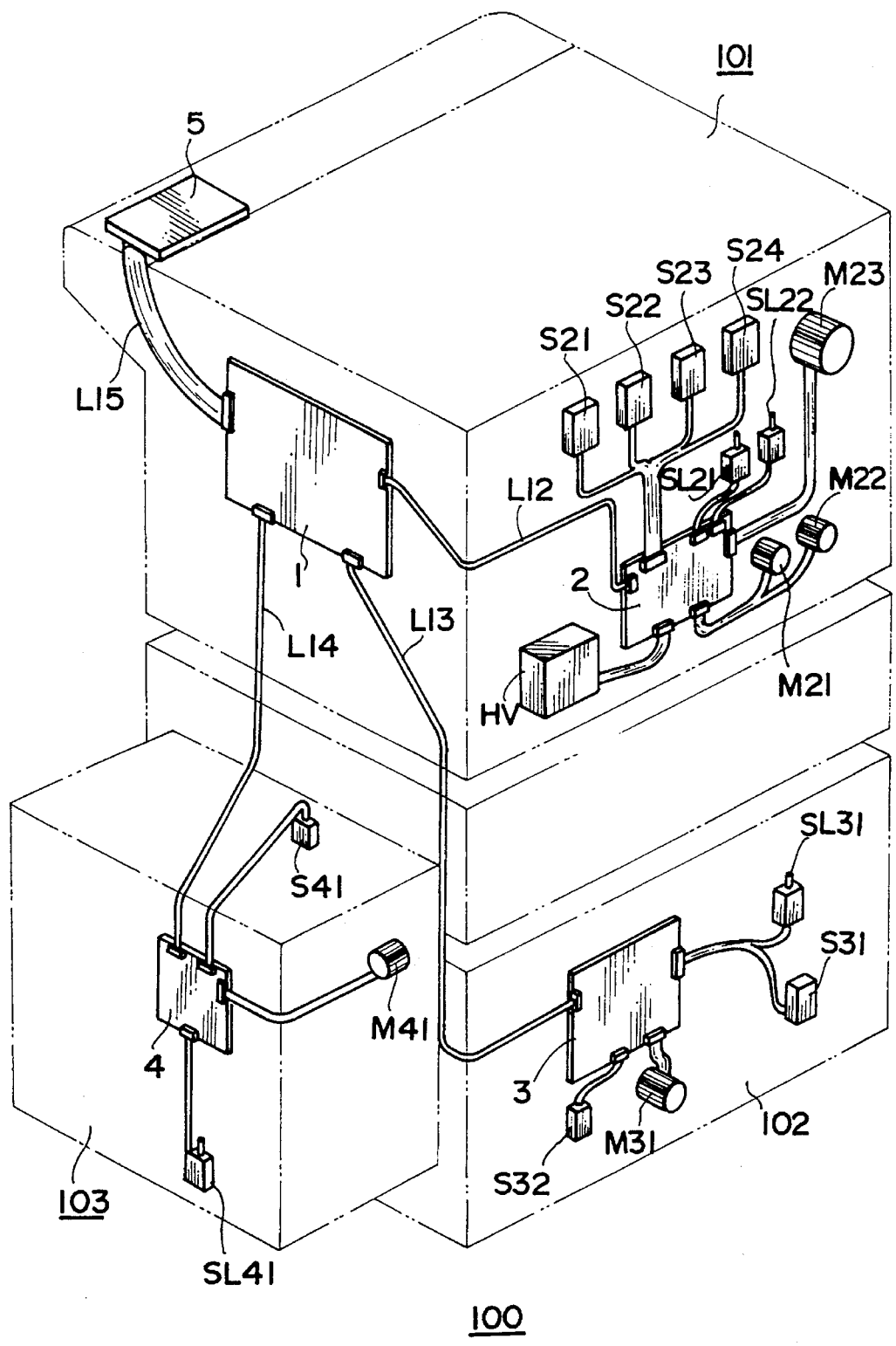
FIG. 1 is a perspective view showing the arrangement of the control section of a copying apparatus related to the present invention.
Figure 2:
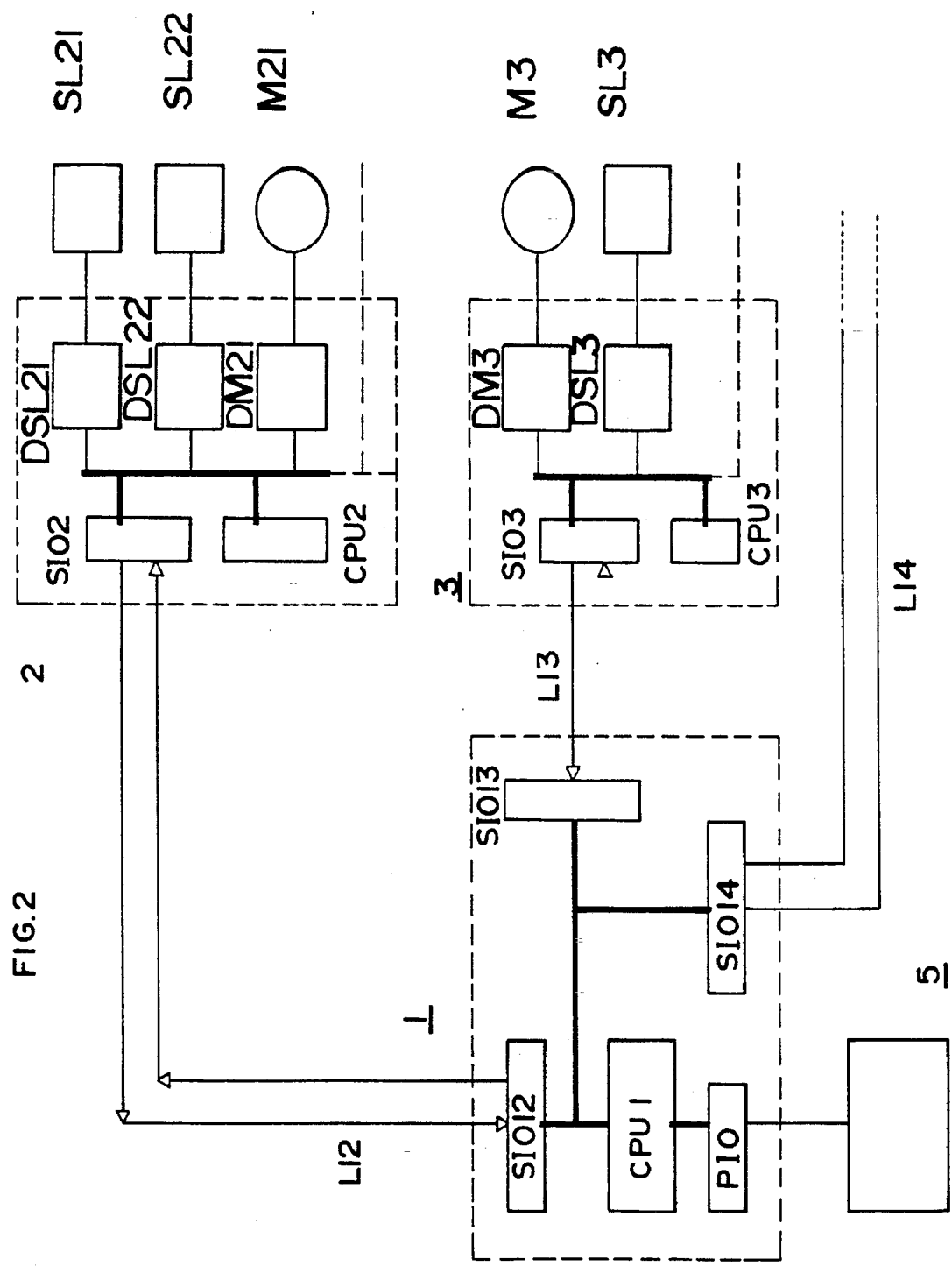
FIG. 2 is a block diagram showing the control section of FIG. 1.

FIG. 1 is a perspective view showing the arrangement of the control sections of a copying apparatus related to the present invention. FIG. 2 is a block diagram of the aforesaid control section. In FIG. 1, the exterior frame of copying apparatus 100 is indicated by a dashed line. Copying apparatus 100 comprises main unit 101, first paper supply unit 102, and second paper supply unit 103.

Main unit 101 is a copying apparatus using an electrophotographic process to produce on a copy sheet a toner image corresponding to an original document image. That is, an original document image is optically scanned by an optical scanning device (not shown in the illustrations) so as to form an electrostatic latent image on the surface of a photosensitive member (also not shown in the illustrations), said electrostatic latent image then being developed as a toner image, transferred onto a copy sheet and fixed to said copy sheet to produce a hard copy. First paper supply unit 102 is provided below main unit 101; the stacked copy sheets accommodated in unit 102 are fed one sheet at a time via a feed roller (not shown in the drawing) to main unit 101. Second paper supply unit 103 is provided at the side of first paper supply unit 102, and feeds copy sheets to main unit 101 via the same feed roller (not illustrated) as that used by first paper supply unit 102.

The operation section is described hereinafter. Main control section 1 is provided on the interior side of main unit 101, and is connected to sub-control units 2, 3, and 4 via communication lines L12, L13, and L14, and is connected to operation panel 5 via communication line L15. Main control section 1 executes sequence controls for the entire copy apparatus 100, and transmits control signals to sub-control sections 2–4, and receives signals transmitted from said sub-control sections 2–4, then sequentially executes the copy process.

Sub-control section 2 is provided on the back interior side of main unit 101, and is connected to main control section 1 via communication line L12, and is connected to controlled sections which include photosensitive member drive motor M21, optical scanner drive motor M22, copy sheet transport roller (not illustrated) drive motor M23, clutch (not illustrated) drive solenoids SL21, and SL22, and charging/discharging charger (not shown in the drawings) power source HV. Sub-control section 2 is also connected to microswitches S21~S24 for detecting the position of the optical scanner. Sub-control section 2 controls the operation of the previously mentioned controlled sections in accordance with control signals transmitted from main control section 1, and outputs detection signals received from the aforesaid microswitches S21~S24 to said main control section 1.

Sub-control section 3 is provided within first paper supply unit 102, and is connected to main control section 1 via communication line L13, and is connected to controlled sections which include paper feed roller drive motor M31 and clutch drive solenoid SL31 of first paper supply unit 102. Sub-control section 3 is also connected to microswitches S31 and S32 for detecting the transport condition of sheets during transport.

Similarly, sub-control section 4 controls second paper supply unit 103, and is connected to paper supply roller drive motor M4, clutch drive solenoid SL41, and microswitch S41 for detecting the transport state of sheets during transport. Sub-control section 4 is also connected to main control section 1 via communication line L14, and is itself controlled by control signals received from said main control section 1.

Operation panel 5 comprises switch groups (not shown in the drawings) for operation input, and display element groups (not shown in the drawings). Only the switch groups for control input, and display elements for the controlled sections of operation panel 5 are directly connected to main control section 1.

Main control section 1 comprises microcomputer CPU1 provided with internal random access memory (RAM) and read only memory (ROM), serial interfaces SIO12~14, and parallel interface PIO. The aforesaid interfaces SIO12~14 and PIO are linked by an 8-bit data bus. Each serial interface SIO12~SIO14 is used for parallel-to-serial data conversion, and serial-to-parallel data conversion. Specifically, parallel signal received from the 8-bit data bus are converted to serial signals and output through communication lines L12~L14; and serial data received from communication lines L12~L14 are converted to 8-bit parallel data which are output to the aforesaid data bus. Parallel interface PIO controls the switch groups and display elements of operation panel 5.

Sub-control section 2 comprises microcomputer CPU2 provided with internal RAM and ROM, serial interface SIO2, and drive circuits DSL21, DSL22, and DM21 for driving solenoids SL21 and SL22, and motor M21, which are linked via an 8-bit data bus. Serial interface SIO2 is connected to a data and communication line L12, and is used for serial-to-parallel data conversion, and parallel-to-serial data conversion. In FIG. 2, motors M22 and M23, solenoids SL21 and SL22, power source HV, microswitches S21~S24, and the data buses and interface circuits provided therebetween are used for other data input and output.

Sub-control sections 3 and 4 have functions substantially similar to sub-control section 2 and differ only in the objects of input and output. Therefore, further description is omitted herefrom.

In the copying apparatus of the previously described construction, microcomputer CPU1 of main control section 1 outputs control signals with a predetermined timing to microcomputer CPU2~CPU4 via the respective communication lines L12, L13, L14 in accordance with copy state designations from operation panel 5. Microcomputer CPU2~CPU4 which respectively receive the aforesaid signals execute controls relative to the various controlled sections (e.g., motors, solenoids and the like). The results of the aforesaid controls of the various controlled sections are transmitted as input element (microswitches and the like) detection signals from microcomputer CPU2~CPU4 of sub-control sections 2–4 to microcomputer CPU1 of main control section 1 via communication lines L12~L14, and are used by microcomputer CPU1 for the output timing of subsequently output control signals. Transmission and reception of signal between the control sections is accomplished in the aforesaid sequence to execute normal copy operations, and execute controls for the detection of malfunctioning parts.

Figure 3:
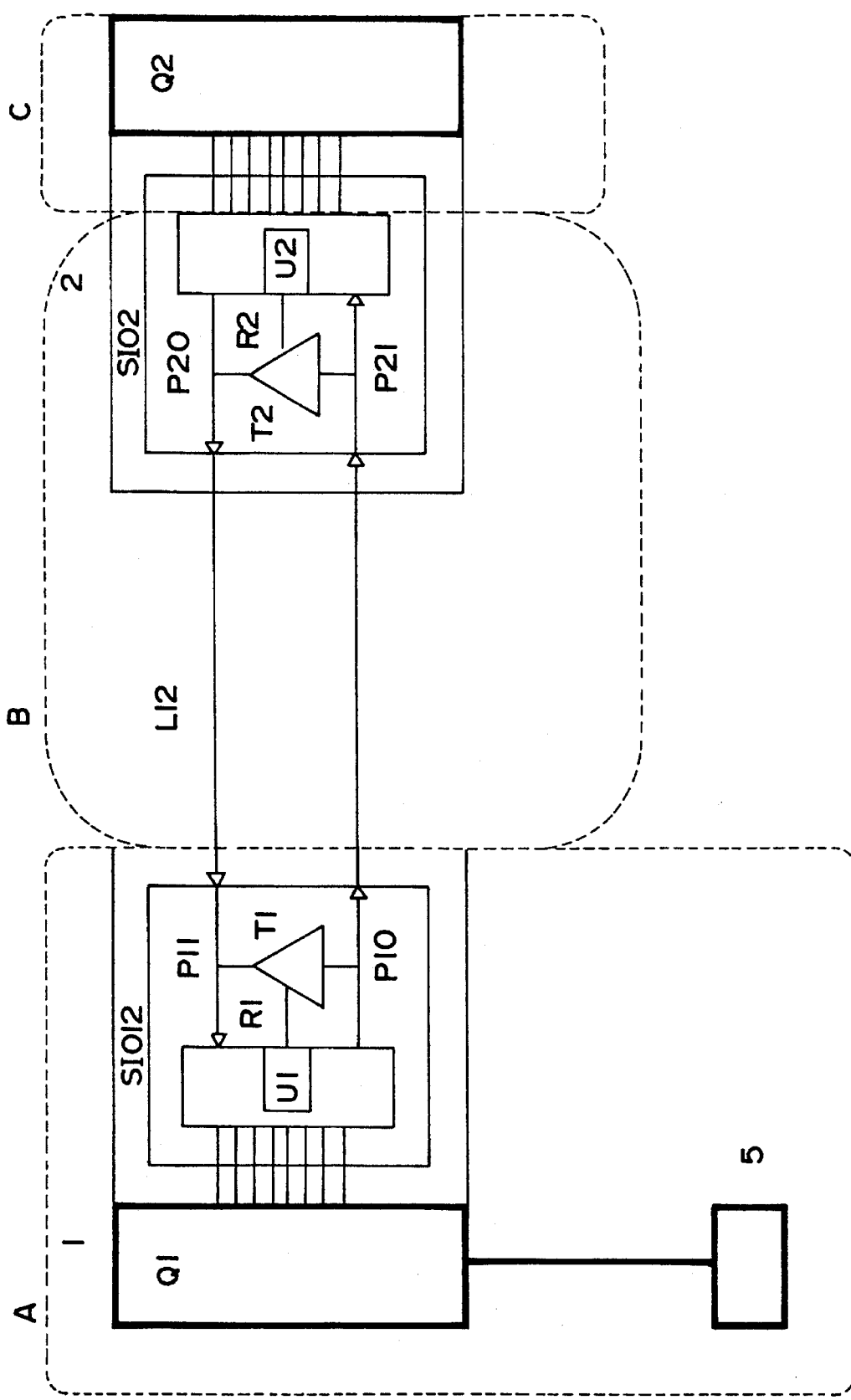
FIG. 3 is a block diagram showing the communications section between main control section 1 and sub-control section 2 in the control block of FIG. 2.
Figure 4:
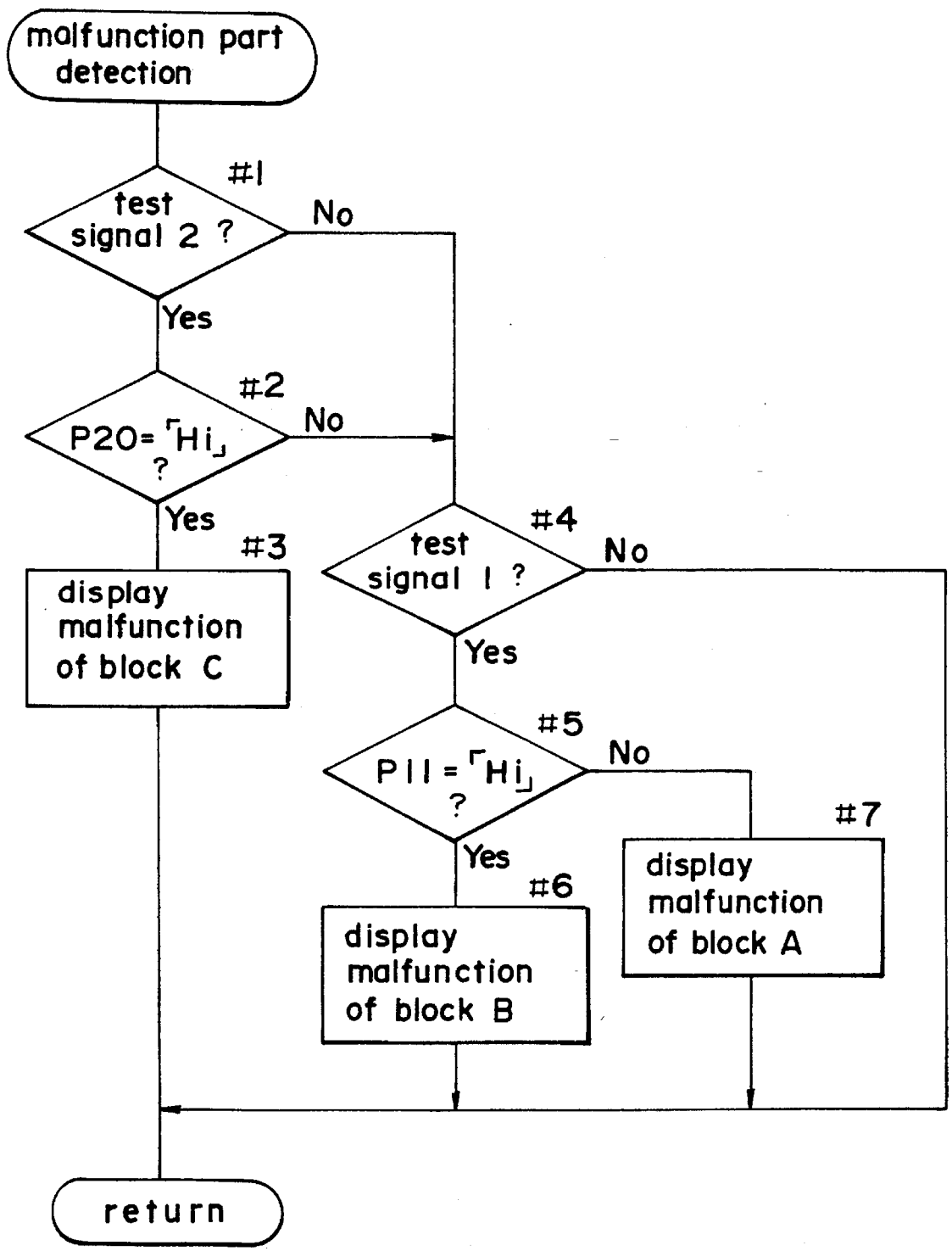
FIG. 4 is a flow chart showing the sequence for detecting a malfunctioning part in main control section 1 and sub-control section 2.

The sequence for detecting malfunctioning parts is described below with reference to FIGS. 3 and 4. FIG. 3 is a block diagram showing the communication section between main control section 1 and sub-control section 2 among the control blocks of FIG. 2. FIG. 4 is a flow chart showing the sequence for detecting malfunctioning parts in main control section 1 and sub-control section 2. In FIG. 3, reference numbers Q1 and Q2 shows the construction other than serial interfaces SIO 12 and SIO 2 in each control section 1 and 2. It is to be noted that Q2 includes controlled objects such as motor M21, solenoid SL21, SL22 and the like. Sub-control section 2 is a part of the controlled objects controlled by main control section 1.

Serial interface SIO12 is provided with tri-state buffer T1, the input pin and output pin of which are respectively connected to output pin P10 and input pin P11 of serial interface SIO12. Control pin R1 is connected to command interpreter U1 of serial interface SIO12. Command interpreter U1 is a logic circuit, which sets control pin R1 of tri-state buffer T1 to high level "Hi" for a predetermined period in accordance with predetermined signals from CPU1. When control pin R1 of tri-state buffer T1 is receiving high level "Hi" signals, the circuit between output pin P10 and input pin P11 is shorted, such that signals output from output pin P10 are directly retransmitted to input pin P11. On the other hand, serial interface SIO2 is provided with tri-state buffer T2, the input pin and output pin of which are respectively connected to input pin P21 and output pin P20 of serial interface SIO2, and control pin R2 is connected to command interpreter U2 of serial interface SIO2. While control pin R2 of tri-state buffer T2 is receiving high level "Hi" signals, the circuit between input pin P21 and output pin P20 is shorted, such that signals output from output pin P10 of serial interface SIO12 are retransmitted to input pin P11 through a communication line.

In general, copying apparatus of the previously described type can be set in a test mode via operation of predetermined switches on operation panel 5. In a test mode, for example, motor M2 alone may be experimentally rotated via the operation of a predetermined switch on operation panel 5.

For example, when abnormal developing occurs because motor M2 does not rotate, the problem may originate in main control section 1, communication lines L12, or sub-control section 2. That is, the problem may originate in any of the three blocks A, B, or C indicated by the broken line in FIG. 3.

When the copying apparatus is set to the test mode after the aforesaid condition has been generated, the below procedures follow.

(1) A switch is designated on operation panel 5 so that microcomputer CPU1 outputs a signal (test signal 2) to set control pin R2 of tri-state buffer T2 in serial interface SIO2 to high level "Hi" for a predetermined period (step #1: YES). In accordance with the aforesaid test signal 2, command interpreter U2 of serial interface SIO2 sets control pin R2 of tri-state buffer T2 to high "Hi" level for a predetermined period, and the communication line is shorted. At this time, if a high "Hi" level setting of output pin P20 is detected (step #2: YES), block A and block B are normal, and block C is determined to be malfunctioning, and this information is displayed (step #3). At this point, block C can be repaired by being individual checked, or by replacing components.

(2) If a high "Hi" level setting of output pin P20 is not detected (step #2: NO), a switch is designated on operation panel 5 such that microcomputer CPU1 outputs a signal (test signal 1) to set control pin R1 of tri-state buffer T1 in serial interface SIO12 to high "Hi" level (step #4: YES). In accordance with the aforesaid test signal 1, command interpreter U1 of serial interface SIO12 sets control pin R1 of tri-state buffer T1 to high "Hi" level.

(2-1) At this time, if a high "Hi" level setting of input pin P11 is detected (step #5: YES), block A is normal, block B is determined to be malfunctioning, and this information is displayed (step #6). Although it is unclear whether or not block C is malfunctioning, the prospects of the repair operation are improved by always first determining if block B requires repair. After repairing block B, the check of step (1) above is repeated so as to ascertain the condition of block C.

(2-2) If a high "Hi" level setting of input pin P11 is not detected (step #5: NO), block A is always determined to be malfunctioning, and this information is displayed (step #7). It is unclear whether or not blocks B or C are malfunctioning. The detection process continues after block A is repaired. After completing repair of block A, the check of step (1) above is repeated to determined whether or not blocks B or C require repair.

The sequences for checking sub-control sections 3 and 4, and communication lines L13 and L14 are accomplished in the same manner.

Figure 5:
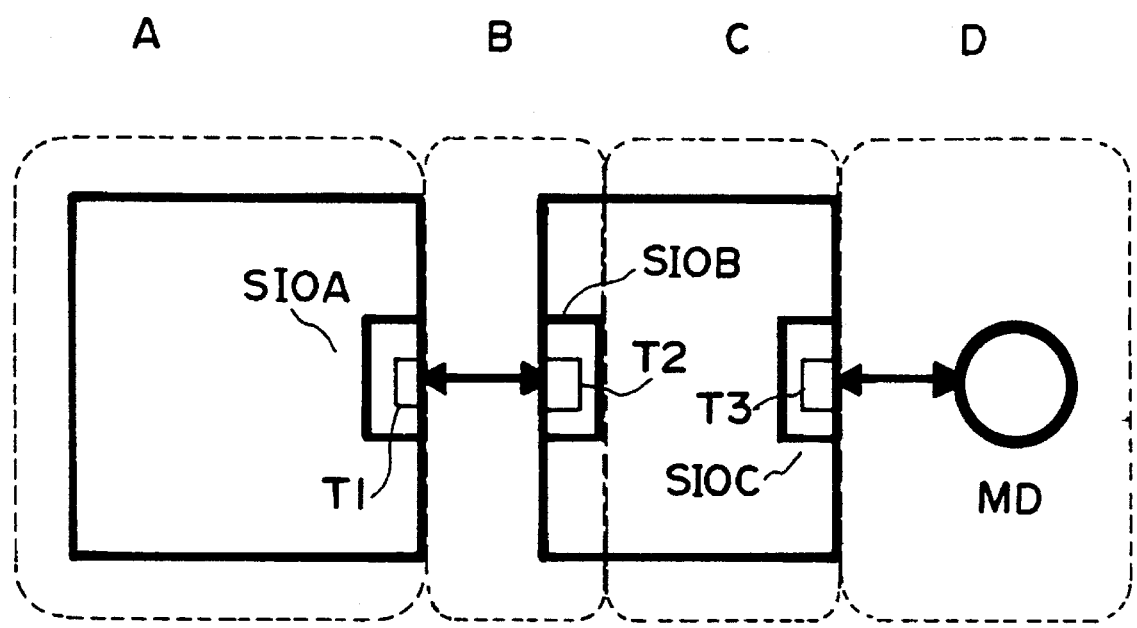
FIG. 5 is an illustration showing a second embodiment of the present invention.

FIG. 5 is a block diagram showing the concept of a second embodiment of the present invention. Although the first embodiment has been described by way of example of controls blocks divided into three sections A, B, and C, the present embodiment further links control block D having a motor MD. The various control blocks A~D are connected to communicate with each other through lines L100 and L200 via serial interfaces SIO100~SIO300, so as to exchange signals. The sequence for detecting malfunctioning parts may be readily understood if the sequence of the first embodiment is expanded.

For example, assume motor MD does not rotate.

(1) first, tri-state buffer T3 is set at high "Hi" level. If tri-state buffer T3 is detected in the ON state at this time, block D is determined to be malfunctioning and blocks A, B, and C are normal.

(2) On the other hand, if a high "Hi" level setting of tri-state buffer T3 is not detected, tri-state buffer T2 is switched ON. At this time, if tri-state buffer T2 is detected in the high "Hi" level setting, block C is determined to be malfunctioning, and blocks A and B are normal; the condition of block D is unclear.

(3) If tri-state buffer T2 is not detected in the high "Hi" level setting, tri-state buffer T1 is set to high "Hi" level.

At this time, if tri-state buffer T1 is detected in the ON state, block B is determined to be malfunctioning, block A is normal, and the condition of blocks C and D are unclear.

On the other hand, if tri-state buffer T1 is not detected in the ON state, block A is determined to be malfunctioning, and the condition of block B, C, and D are unclear.

Malfunctioning parts can be detected by the aforesaid sequence.

Copying apparatus management systems are known which diagnose the condition of copying apparatus by remote operations via modem and telephone lines, and the present invention is also applicable to such systems. In such applications, the main control section of a copying apparatus becomes a single sub-control section, and the control section of the remotely located copying apparatus management unit becomes the main control section, wherein detection of malfunctioning parts is accomplished in the same sequence as previously described by means of transmission of test signals between the two locations.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A malfunctioning parts detecting device providing:

a main central processing unit;

a sub central processing unit;

communication lines which connect the main central processing unit and the sub-central processing unit to execute desired operations by means of mutual intercommunication therethrough between the main central processing unit and the sub central processing unit;

a tri-state buffer provided between the communication lines for shorting the communication lines when a test signal is output from the main central processing unit; and a command interpreter which detects whether the test signal output from the main central processing unit is retransmitted to the main central processing unit through the communication lines shorted by the test signal.

2. A malfunctioning parts detecting device providing:

a control section;

sub-control sections connected to said control section through communication lines and executing desired operations by means of mutual intercommunication with said control section through the communication lines;

reply means actuated by a predetermined signal output from said control section and provided between said communication lines and said control section for retransmitting to said control section the predetermined signal;

detecting means for detecting anomalous operation of the control section when the predetermined signal output from said control section is transmitted to said reply means and the predetermined signal is not retransmitted back to said control section.

3. The malfunctioning parts detecting device as claimed in claim 2, wherein said communication lines are shorted when said reply means is actuated.

4. A malfunctioning parts detection device providing:

a control section;

sub-control sections connected to said control section through communication lines and executing desired operations by means of mutual intercommunication with said control section through the communication lines;

shorting means provided between said communications lines and each of said sub-control sections for shorting the communication lines when a predetermined signal is output from said control section; and detecting means which detects anomalous operation of one of the sub-control sections when the predetermined signal output from said control section is transmitted through the shorted communication lines and retransmitted back to said control section.

5. A malfunctioning parts detection device providing:

a control section;

sub-control sections connected to said control section through communication lines and executing desired operations by means of mutual intercommunication with said control section through said communication lines;

first reply means actuated by a first predetermined signal output from said control section and provided between said communication lines and said control section for retransmitting the first predetermined signal to said control section;

second reply means actuated by a second predetermined signal output from said control section and provided between said communication lines and each of said sub-control sections for retransmitting the second predetermined signal to said control section; and detecting means which detects anomalous operation of one of the sub-control sections when the second predetermined signal is transmitted to said second reply section and is not retransmitted back to said control means, and detects anomalous operation of the control section when the first predetermined signal is transmitted to said first reply section and is retransmitted back to said control means.

6. A malfunctioning parts detection device as claimed in claim 5 further comprising a controlled section connected with said sub-control section, wherein said detecting means detects anomalous operation of the controlled section when the second predetermined signal is transmitted to said second reply means and retransmitted back to said control section.

7. A method of detecting malfunctioning parts in an apparatus including a control section and sub-control sections connected to said control section through communication lines for executing desired operations by means of mutual intercommunication with said control section through said communication lines, comprising the following steps of:

outputting a first predetermined signal from said control section so as to actuate a first shorting means provided between the communication lines and each of the sub-control sections for shorting the communication lines;

detecting anomalous operation of one of the sub-control sections when the first predetermined signal is retransmitted back to the control section through the communication lines shorted by first shorting means;

outputting a second predetermined signal from said control section so as to actuate a second shorting means provided between the communication lines and the control section for shorting the communication lines; and detecting anomalous operation of the control section when the second predetermined signal is not retransmitted back to the control section through the communication lines shorted by second shorting means.

* * * * *